(12) United States Patent
Fuergut et al.

(10) Patent No.: US 9,275,916 B2
(45) Date of Patent: Mar. 1, 2016

(54) REMOVABLE INDICATOR STRUCTURE IN ELECTRONIC CHIPS OF A COMMON SUBSTRATE FOR PROCESS ADJUSTMENT

(71) Applicant: Infineon Technologies AG, Neubiberg (DE)

(72) Inventors: Edward Fuergut, Dasing (DE); Irmgard Escher-Poeppel, Duggendorf (DE); Manfred Engelhardt, Villach-Landskron (AT); Hans-Joerg Timme, Ottobrunn (DE); Hannes Eder, Villach-Landskron (DE)

(73) Assignee: Infineon Technologies AG, Neubiberg (DE)

( * ) Notice: Subject to any disclaimer, the term of this patent is extended or adjusted under 35 U.S.C. 154(b) by 140 days.

(21) Appl. No.: 13/886,283

(22) Filed: May 3, 2013

(65) Prior Publication Data

US 2014/0327003 A1 Nov. 6, 2014

(51) Int. Cl.
| | |
|---|---|
| *H01L 21/66* | (2006.01) |
| *H01L 21/67* | (2006.01) |
| *H01L 21/784* | (2006.01) |
| *H01L 23/00* | (2006.01) |
| *H01L 21/683* | (2006.01) |
| *H01L 21/56* | (2006.01) |

(52) U.S. Cl.
CPC .......... *H01L 22/24* (2013.01); *H01L 21/67069* (2013.01); *H01L 21/67253* (2013.01); *H01L 21/6835* (2013.01); *H01L 21/6836* (2013.01); *H01L 21/784* (2013.01); *H01L 22/26* (2013.01); *H01L 22/30* (2013.01); *H01L 24/19* (2013.01); *H01L 24/96* (2013.01); *H01L 24/97* (2013.01); *H01L 21/568* (2013.01); *H01L 22/12* (2013.01); *H01L 2221/6834* (2013.01); *H01L 2221/68327* (2013.01); *H01L 2224/0401* (2013.01); *H01L 2224/04105* (2013.01); *H01L 2224/12105* (2013.01); *H01L 2224/94* (2013.01); *H01L 2924/1305* (2013.01); *H01L 2924/1306* (2013.01); *H01L 2924/13055* (2013.01); *H01L 2924/13091* (2013.01); *H01L 2924/1461* (2013.01); *H01L 2924/181* (2013.01); *H01L 2924/18162* (2013.01)

(58) Field of Classification Search
CPC ................................ H01L 22/20; H01L 22/26
See application file for complete search history.

(56) References Cited

U.S. PATENT DOCUMENTS

| | | | | |
|---|---|---|---|---|
| 7,286,948 | B1* | 10/2007 | Shannon et al. ................. | 702/76 |
| 7,674,654 | B2* | 3/2010 | Brunnbauer et al. ........... | 438/113 |
| 7,923,350 | B2* | 4/2011 | Mahler et al. ................... | 438/462 |
| 2003/0003607 | A1* | 1/2003 | Kagoshima et al. ............ | 438/14 |
| 2004/0069747 | A1* | 4/2004 | Patel et al. ....................... | 216/59 |
| 2004/0191937 | A1* | 9/2004 | Patel et al. ....................... | 438/21 |
| 2004/0191946 | A1* | 9/2004 | Patel et al. ....................... | 438/57 |
| 2005/0221617 | A1* | 10/2005 | Rueger ........................... | 438/706 |
| 2006/0022266 | A1* | 2/2006 | Messenger et al. ............ | 257/347 |
| 2007/0087464 | A1* | 4/2007 | Rudhard ........................ | 438/50 |

(Continued)

*Primary Examiner* — Joseph C Nicely

(57) ABSTRACT

A method of processing a plurality of packaged electronic chips being connected to one another in a common substrate is provided, wherein the method comprises etching the electronic chips, detecting information indicative of an at least partial removal of an indicator structure following an exposure of the indicator structure embedded within at least a part of the electronic chips and being exposed after the etching has removed chip material above the indicator structure, and adjusting the processing upon detecting the information indicative of the at least partial removal of the indicator structure.

14 Claims, 6 Drawing Sheets

(56) References Cited

U.S. PATENT DOCUMENTS

| | | | |
|---|---|---|---|
| 2007/0105390 A1* | 5/2007 | Oh | 438/710 |
| 2007/0145347 A1* | 6/2007 | Katayama et al. | 257/9 |
| 2007/0173064 A1* | 7/2007 | Vinet et al. | 438/710 |
| 2007/0241417 A1* | 10/2007 | Huibers et al. | 257/436 |
| 2008/0092377 A1* | 4/2008 | Heitzinger | 29/846 |
| 2009/0014889 A1* | 1/2009 | Barth et al. | 257/777 |
| 2009/0299668 A1* | 12/2009 | Luoh et al. | 702/81 |
| 2010/0032587 A1* | 2/2010 | Hosch et al. | 250/492.3 |
| 2011/0168671 A1* | 7/2011 | Yamartino et al. | 216/59 |
| 2013/0016344 A1* | 1/2013 | Bullock et al. | 356/217 |
| 2013/0049205 A1* | 2/2013 | Meyer et al. | 257/773 |
| 2013/0132014 A1* | 5/2013 | Igarashi et al. | 702/81 |
| 2014/0106477 A1* | 4/2014 | Chen et al. | 438/9 |
| 2015/0108666 A1* | 4/2015 | Engelhardt et al. | 257/787 |

* cited by examiner

REMOVABLE INDICATOR STRUCTURE IN ELECTRONIC CHIPS OF A COMMON SUBSTRATE FOR PROCESS ADJUSTMENT

BACKGROUND OF THE INVENTION

1. Field of the Invention

The present invention relates to methods of and devices for processing a plurality of electronic chips on substrate level, to an electronic chip, and to an article.

2. Description of the Related Art

Conventional packages, such as mold structures, for electronic chips have evolved to a level where the package no longer significantly impedes the performance of the electronic chips. Moreover, processing electronic chips on wafer level is a known procedure for efficiently producing them. Etching electronic chips is a conventional technique for removing material therefrom.

However, there is still potentially room to reduce manufacturing cost and simplify processing of electronic chips to be packaged while maintaining a high accuracy of the processing.

SUMMARY OF THE INVENTION

There may be a need to provide a possibility to manufacture electronic chips with a simple processing architecture and with a high precision with regard to chip material remaining after the processing.

According to an exemplary embodiment, a method of processing a plurality of packaged electronic chips being connected to one another in a common substrate is provided, wherein the method comprises etching the electronic chips, detecting information indicative of an at least partial removal of an indicator structure following an exposure of the indicator structure embedded within at least a part of the electronic chips and being exposed after the etching has removed chip material above the indicator structure, and adjusting the processing upon detecting the information indicative of the at least partial removal of the indicator structure.

According to another exemplary embodiment, a method of processing a plurality of electronic chips being connected to one another by a common substrate is provided, wherein the method comprises plasma etching the electronic chips simultaneously, detecting volatile matter in an environment of the plasma-etched electronic chips to thereby derive information indicative of an exposure of an indicator layer embedded within the electronic chips and being exposed after the etching has removed chip material above the indicator layer, wherein the volatile matter is impacted by the exposure of the indicator layer, and adjusting the plasma etching upon detecting the exposure of the indicator layer.

According to yet another exemplary embodiment, a device for processing a plurality of packaged electronic chips being connected to one another in a common substrate is provided, wherein the device comprises etching means configured for etching the electronic chips, detection means configured for detecting information indicative of an at least partial removal of an indicator structure following an exposure of the indicator structure embedded within at least a part of the electronic chips and being exposed after the etching has removed chip material above the indicator structure, and control means being supplied with the detected information and being configured for adjusting the processing upon detecting the information indicative of the at least partial removal of the indicator structure.

According to yet another exemplary embodiment, a device for processing a plurality of packaged electronic chips being connected to one another in a common substrate is provided, wherein the device comprises etching means configured for etching the electronic chips, detection means configured for detecting information indicative of an at least partial removal of an indicator structure following an exposure of the indicator structure embedded within at least a part of the electronic chips and being exposed after the etching has removed chip material above the indicator structure, and control means being supplied with the detected information and being configured for adjusting the processing upon detecting the information indicative of the at least partial removal of the indicator structure.

According to yet another exemplary embodiment, an article is provided which comprises a substrate, a plurality of electronic chips being connected to one another within or by the substrate, and a continuous or discontinuous indicator layer embedded within the electronic chips, wherein the indicator layer is configured to be at least partially removable from the electronic chips by plasma etching so that a plasma etching product of the indicator layer impacts volatile matter in an environment of the electronic chips so that the exposure of the indicator layer is detectable by analyzing the volatile matter.

According to still another exemplary embodiment, an electronic chip is provided which comprises a semiconductor substrate, at least one integrated circuit component being integrated in the semiconductor substrate, an indicator layer forming an exterior surface portion of the semiconductor substrate, wherein the indicator layer is configured to be at least partially removable by plasma etching so that its plasma etching product impacts volatile matter in an environment of the semiconductor substrate so that the exposure of the indicator layer is detectable by analyzing the volatile matter, and a mold structure covering at least a part of the semiconductor substrate.

An exemplary embodiment may have the advantage that the start of the removal of material of an indicator structure in an interior of electronic chips (such as semiconductor chips) by etching is detected in terms of analyzing volatile matter being generated when the etching procedure removes at least part of the indicator structure from the electronic chips. A corresponding detection signal may indicate that the etching procedure has reached the indicator structure and may hence be used as a trigger for adjusting the subsequent processing procedure of the electronic chips. The detection of the event of the beginning of the removal of material of the indicator structure embedded in the electronic chips may be an accurate and failure robust way of obtaining unambiguous information that the processing has reached a certain level which may require that the further processing of the electronic chips is to be adjusted. Thus, process control may not depend on guessing or making questionable assumptions, but in contrast to this may be accurately and reproducibly performed based on an easily detectable signal which is directly generated by the indicator or signal structure.

DESCRIPTION OF FURTHER EXEMPLARY EMBODIMENTS

In the following, further exemplary embodiments of the methods, the devices, the electronic chip and the article will be explained.

A gist of an exemplary embodiment can be seen in that an imbedded indicator structure (such as an indicator layer, indicator dots, etc.) can be formed within electronic chips (such as semiconductor chips) for well-defined thinning (particularly plasma thinning) in package (TIP). Such an imbedded structure may be used for triggering the etch endpoint by aborting the etch process, or may trigger any other adaptation of the chip processing.

During the common etching procedure on substrate level, the electronic chips may be unpackaged or may be packaged by a mold structure (which may also be denoted as an encapsulation structure). In the context of the present application, the term "packaged" may particularly denote that the electronic chips are housed or accommodated in a package. A package, in turn, can be denoted as a casing (for instance of a metal, a plastic, a glass or a ceramic material) which contains the electronic chips. Such a package may provide protection against impact and corrosion, may hold contact pins or leads and/or may dissipate heat produced in the electronic chips in normal operation. Packaging the electronic chips prior to the etching procedure is highly advantageous, since this significantly simplifies handling of the sensitive electronic chips which may have a very small thickness after the back etching procedure.

A corresponding procedure may comprise packaging individual electronic chips or a bulk wafer with integrated electronic chips by a mold structure (such as a mold substrate), thinning the electronic chips while being packaged, and singularizing (or separating) the individual electronic chips so that each singularized thinned electronic chip also comprises a supporting portion of the mold structure. Thus, only serial procedures need to carried out with the individual thinned chips rather than sequential procedures. Hence, no handling of thin electronic chips without supporting package is necessary. During the processing, the mold structure may further serve as a mask so that additional (particularly backside) masks are dispensable, or the number of masks can be reduced.

Particularly, such a processing concept may allow the production of electronic chips with precisely defined properties of the material (such as a sequence of semiconductor layers) remaining after the processing, even when the variations of properties of the initial material (such as variations between different molded wafers, variations between different portions of a processed wafer, variations involved with grinding a wafer, variations involved during the etching of substrate material) show considerable deviations as a consequence of considerable tolerances. In other words, the implementation of an indicator structure for process control allows to adjust a precisely defined thickness of the remaining semiconductor material even when the initial thickness of the semiconductor structure has been undefined or only very roughly defined. For instance, the accuracy of the thickness adjustment according to exemplary embodiments may be in the order of magnitude of a few micrometers or less, which is significantly better than an accuracy which can be obtained with conventional approaches.

According to an exemplary embodiment, the manufacture of extremely thin electronic chips is made possible, particularly for applications in which the thickness of the electronic chip is correlated with an electric function, rather than fulfilling only a purely geometric purpose. For power electronic applications for instance, a thinned semiconductor structure results in a very small electric resistance, since a current path through this thinned semiconductor structure may be kept short, so that the transport of an electric signal from an external member into the electronic chip as well as the transport of an electric signal from the electronic chip to an external member may be accomplished with low power losses (such as ohmic losses). In another application in the field of microelectromechanical systems (MEMS), a thinned semiconductor structure may for instance be used as a membrane of a sensor or of an actuator which can therefore be manufactured with a small thickness and hence a high sensitivity.

In an embodiment, the indicator structure may be an etch stop indicator structure. Such an etch stop indicator structure may, when its removal begins and its material is converted from a solid phase into a volatile phase (such as plasma or gas), provide a signal which may trigger the end of the etching procedure.

Particularly, gas etching methods (such as plasma etching) may be implemented according to embodiments, and the material to be etched is preferably silicon, for instance crystalline silicon or polysilicon. The etching may be carried out by using an etching gas.

In an embodiment, etching the electronic chips is performed by plasma etching, for instance using chlorine or fluorine. Such a plasma etching procedure may be modified after having sensed the at least partial removal of the indicator structure. "Plasma etching" may also be denoted as reactive-ion etching (RIE) and is an etching technology which uses chemically reactive plasma to remove material deposited on wafers. The plasma is generated under low pressure by an electromagnetic field. High-energy ions from the plasma attack the wafer surface and react with it. Upon performing plasma etching, it is conventionally difficult to clearly and accurately determine that the etching procedure has proceeded until a desired depth of the electronic chip (such as a semiconductor layer sequence). When the plasma etching starts removing the indicator structure, this can be taken as a trigger for stopping the plasma etching procedure.

Correspondingly, the etching means may be plasma etching means configured for plasma etching the electronic chips. Particularly, the plasma etching means may be configured as reactive ion etching means.

In an embodiment, detecting the information is performed by analyzing volatile matter in an environment of the electronic chips (particularly within an etching chamber). Such volatile matter is impacted by an etching product generated by removing material of the indicator structure from the electronic chips by the etching. In other words, a gas or plasma product or substance generated in the environment of the etched electronic chips when the etching attacks the indicator structure can be analyzed. Thus, the detection may be performed in the etching chamber by analyzing gaseous and/or plasma matter having a property or composition which changes characteristically when the etching procedure starts attacking the indicator structure. Hence, a corresponding sensor can be placed conveniently at any desired location within the etching chamber or in an exhaust conduit for detecting changes in the composition of the volatile matter.

Correspondingly, the detection means may be configured for detecting information by analyzing volatile matter in an environment of the electronic chips which volatile matter is impacted by an etching product generated by removing material of the indicator structure from the electronic chips by the etching. The detection means may apply one or more decision criteria depending on the result of the detection which specifies whether or not the indicator structure removal is assumed to have already started. A sensor of the detection means may be located directly in the plasma chamber or in an exhaust channel downstream of the plasma chamber.

In an embodiment, the analyzed volatile matter is plasma which is also used for plasma etching, but which is impacted by the etch attack on the indicator structure. Since the removal of the indicator structure has also an impact on the plasma within the etching chamber itself, a change in the chemical composition of the plasma is a fingerprint that the removal of the indicator structure from the electronic chips has started and can be therefore be used as a trigger for stopping the etching procedure.

In an embodiment, analyzing the plasma is performed by Optical Emission Spectroscopy and/or Coherent Anti Stokes Raman Scattering (CARS). These analytical methods are advantageous. However, also other analytical methods may be used as well for analyzing the plasma within the etching chamber.

In an embodiment, the analyzed volatile matter is exhaust gas or effluent gas generated when removing material of the indicator structure by plasma etching. Within the etching chamber, a pressure is maintained by a pump sucking volatile matter away from the etching chamber. Since the volatile matter within the etching chamber is modified upon starting to remove the indicator structure material by etching, the sudden detection of preknown components (corresponding to the chemical composition of the indicator structure) thereof in an exhaust conduit downstream of the etching chamber may be used as a trigger to stop the etching procedure, since this allows drawing the conclusion that the etching procedure has now reached the indicator structure.

In an embodiment, analyzing the exhaust gas or effluent gas is performed by Optical Emission Spectroscopy and/or Mass Spectroscopy. Although these spectroscopic methods are highly suitable for integration into an exhaust conduit, there may be other methods for analyzing the effluent gas from the etching chamber which may be implemented as well.

In an embodiment, the indicator structure may comprise dopant (such as n-dopant or p-dopant), implanted material (for instance an optically detectable or uncommonly heavy or light material, or for instance a non-silicon material when the substrate of the electronic chips is a silicon substrate) and/or a deposited layer (for instance a planar layer which may be continuous or discontinuous). The only requirement for a suitable material of the indicator structure is that it has detectable properties which differ sufficiently from the properties of the surrounding material of the electronic chips.

In an embodiment, all electronic chips are etched simultaneously. By treating the various electronic chips (particularly semiconductor chips with integrated circuits formed therein) on a wafer level, i.e. before a singularization of the individual electronic chips, the etching of all electronic chips at the same time and in one batch is possible. This provides for a very economic treatment of the chips.

In an embodiment, the etching procedure is a selective etching procedure so that an etching rate (i.e. etched material per time) of material of the indicator structure is different from, particularly smaller than or larger than, an etching rate of material directly adjacent or next to the indicator structure. Thus, both the material of the indicator structure as well as the material of its environment may be properly etchable. However, the etched material thickness per etching time may be larger for the surrounding material than for the material of the indicator structure (for instance with a ratio between 2 and 10). The combination of a selective etching procedure and the use of a signal detected upon removal of the indicator structure by etching provides a very reliable architecture for accurately defining an etch stop. In an alternative embodiment, however, the etching rate of the indicator structure is larger than (for instance with a ratio between 2 and 10) the etching rate of adjacent semiconductor material. This will have the consequence that a very pronounced detection signal may be detected when the removal of the indicator structure begins, since this increases the amount of removed detectable material per time interval and therefore increases the sensitivity of the detection.

In an embodiment, the plurality of packaged electronic chips being connected to one another in the common substrate comprise a semiconductor wafer being divided into the electronic chips by mold structures as package. In such an embodiment, the electronic chips are connected directly to one another within the wafer compound, wherein a mold may have several sections defining individual electronic chips within this wafer compound. Packaging electronic chips already on wafer level has the advantage that the handling of individual electronic chips after singularization is significantly simplified, even when the electronic chips have been thinned by the etching procedure to a very small thickness thanks to their connection to a mold part.

In an embodiment, adjusting the processing may comprise stopping the etching, modifying the etching rate (i.e. etched material per time), modifying an etch parameter, modifying the etch process, and continuing the etching with the same etch conditions or with modified etch conditions for a predefined additional etching time interval (before terminating etching). More generally, a first processing sequence or step may be carried out before initiating removal of the indicator structure. Upon detection of the beginning of the removal of the indicator layer, another second processing sequence or step may be started. Hence, in one embodiment, start of the removal of a signal layer (or any other indicator structure) may result in the termination of the etching procedure. Alternatively, detection of the removal may have the consequence that the etching rate is reduced (or increased). It is also possible that the etching is only continued for an additional time interval after the detection of the removal of the indicator structure. Further adaptations of the processing are possible in response to the indicator structure exposure, such as the change of an etchant or the like.

In an embodiment, the indicator structure is an indicator layer. The latter may be embedded at the same depth level within all electronic chips. Therefore, particularly when the etching procedure is anisotropic, the start of the removal of indicator structure sections in different electronic chips may occur simultaneously. By detecting the time dependence of the signal indicating a removal of the individual etch stop indicator sections of the common signal layer, a control of the etching process (for instance in terms of verifying the anisotropic character thereof) is possible. Furthermore, the formation of an indicator layer at the same depth level within all electronic chips on wafer level can be performed with reasonable effort (for instance by a common diffusion or doping procedure).

In an embodiment, the method comprises stopping the etching, and subsequently singularizing the electronic chips from the substrate. Such a singularization or separation of the wafer into the individual chips may be performed by sawing, etching, or the like. Packaging the electronic chips by the mold or encapsulation structure prior to the singularization significantly simplifies handling of the individual, mechanically sensible thinned chips.

In an embodiment, the article is packaged, i.e. comprises a mold structure by which the plurality of electronic chips are packaged. Such a mold structure may be made of a ceramic or plastic material and may serve as a mechanical protection of the electronic chips, for removing heat from the chips and as a support for a lead frame or the like by which the electronic chips can be electrically connected to an environment.

In an embodiment, the substrate comprises a for instance plate-shaped wafer (particularly a semiconductor wafer)

comprising the plurality of electronic chips as sections of the wafer. Thus, while being processed, the electronic chips may still form an integral structure and may be etched on wafer level. In such an embodiment, the indicator structure (for instance a common signal layer at a constant depth level over the entire wafer) provides a proper basis for controlling the common etching process.

In another embodiment, the substrate is a, for instance, plate-shaped, mold comprising a plurality of recesses, wherein each of the recesses accommodates a respective one of the plurality of electronic chips. By housing the individual electronic chips in a for instance two-dimensional array of accommodation volumes formed in an encapsulation substrate (which may be formed particularly by molding liquid or granulate material, which may be denoted as encapsulant, of the mold structure around the individual electronic chips and then hardening the encapsulant), all electronic chips may be subsequently thinned simultaneously without problems occurring from the difficult handling of very thin electronic chips before packaging. Particularly, the article may be configured as an embedded wafer level package (eWLP). eWLP is a packaging technique that uses molded carriers and fan-out redistribution layers. The dies are singulated, embedded into molded carriers, and then reconstituted onto artificial wafers.

In still another embodiment, the substrate is a, for instance plate-shaped, mold comprising a recess accommodating a wafer comprising the plurality of electronic chips as sections of the wafer. In such an embodiment, the entire wafer may be inserted into a single accommodation volume as a whole (particularly by molding liquid or granulate material, which may be denoted as encapsulant, of the mold structure around the wafer and then hardening the encapsulant) and may then be thinned by back etching. Also in such an embodiment, handling of individual thinned electronic chips before packaging them in a mold or encapsulation structure can be advantageously avoided.

In an embodiment, the article is free of an embedded plasma etch resistant layer. Thus, it is dispensable according to exemplary embodiments to provide a conventional etch stop layer (such as a silicon dioxide layer of an SOI substrate, silicon on insulator), which is chemically configured so that the plasma etching procedure is not able to remove this etch stop layer. However, the necessity to provide such an etch stop layer which is not removable by the etching process limits an integrated circuit designer in the composition of the semiconductor chips to special substrates. Furthermore, the provision of an etch stop layer does not give a positive detector signal to an operator indicative of the fact that the etching process should now be stopped, so that some safety time has to be awaited until the etching procedure can be finished to ensure that the etch stop layer is in fact already reached. In contrast to this, exemplary embodiments obtain a positive detection signal indicating that the etching procedure has reached the desired depth in the electronic chips. Thus, the safety and speed of the etching procedure and its termination can be increased.

In an embodiment, the article comprises a surface protection structure arranged below the indicator layer, wherein the surface protection structure is configured to separate the stop indicator layer with regard to at least one of the group consisting of a redistribution structure, a metallization structure and an insulation structure (see for example FIG. 1 and FIG. 2). Therefore, the processing of exemplary embodiments involving the thinning of the electronic chips may be performed after having finished the processing of redistribution, metallization and insulation.

In one embodiment, the electronic chips may be used as sensors or actuators in microelectromechanical systems (MEMS), for example as pressure sensors or acceleration sensors. In another embodiment, the electronic chips may be used as semiconductor chips for power applications for instance in the automotive field and may for instance have at least one integrated insulated-gate bipolar transistor (IGBT) and/or at least one integrated diode. More generally, the electronic chip may comprise at least one integrated circuit component of a group consisting of a switch, a diode, a half bridge, and an inverter. Integrated circuit components of the electronic chips for power modules may hence be switches (such as a metal-oxide-semiconductor field effect transistor (MOSFET), an IGBT, etc.), half bridges (i.e. an inverter leg, with two switches and corresponding diodes), and three-phase inverter (i.e. six switches and corresponding diodes).

Although many exemplary embodiments are described in this description in the context of thin-film technology/semiconductor technology, other exemplary embodiments may also be implemented in the field of printed circuit board (PCB) technology, or in other electronic technologies.

As substrate or wafer, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology. For the packaging, molding or encapsulation, a plastic material or a ceramic material may be used. Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION OF EXEMPLARY EMBODIMENTS

Figure 1:
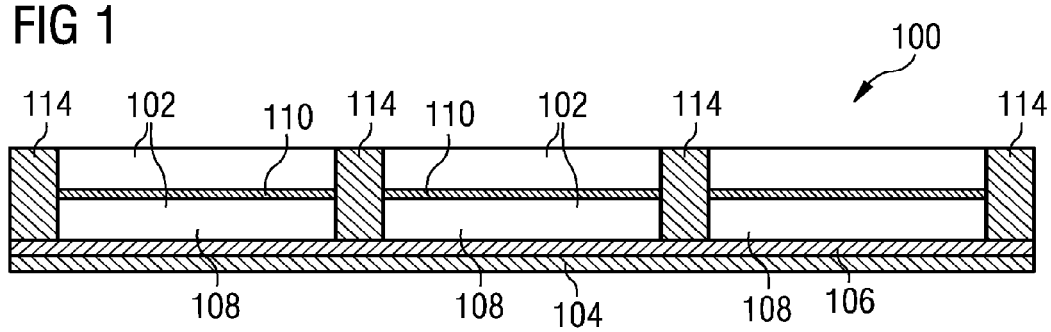
FIG. 1 shows a cross sectional view of an article according to an exemplary embodiment at a beginning of an etching procedure.

The illustration in the drawing is schematically.

A conventional approach of etching electronic chips is a timed plasma etch process, in which the plasma etch process is aborted when the target depth is reached. The process duration may be calculated with the knowledge of the etch rates for the semiconductor substrate. However, variations in substrate etch rate (within a wafer and/or from wafer-to-wafer) translate directly to variations of etch depth and hence to variations of the thinned chips so that no real endpointing is possible.

In another conventional approach, an etch stop layer is implemented in the semiconductor chips at the target depth providing etch stop upon exposure of the etch stop layer due to a high selectivity of the etch process for the substrate over the stop layer, i.e. due to a high ratio of the etch rates of substrate to stop layer. However, this approach requires that the etch stop layer has to be provided in the semiconductor substrates. For example, when using an SOI (silicon on insulator) wafer, it is required to provide a buried silicon dioxide ($SiO_2$) layer as etch stop for plasma thinning of silicon chips which reduces the freedom of designing semiconductor layouts.

In contrast to such conventional approaches, exemplary embodiments implement an indicator layer (or any other physical structure, denoted as indicator structure) in the semiconductor chips providing a detectable signal upon exposure by the substrate etching (such as plasma thinning) process which in turn may be used for adapting the processing, particularly for endpointing the etch process.

For example, elements (such as dopants, implants) contained in the imbedded indicator layer (which will not serve as an etch stop layer due to intrinsically low etch rates in the substrate etch process) at the target etch depth may be released and detected by analyzing the plasma itself (for instance with Optical Emission Spectroscopy or Coherent Anti Stokes Raman Scattering, i.e. CARS) and/or the effluent gas in the pump exhaust (by for instance Mass Spectroscopy or Optical Emission Spectroscopy after excitation of the effluent gas in an ICP (inductively coupled plasma) cell of an ICP-MS (inductively coupled plasma mass spectrometry) apparatus.

More generally, a method of processing a plurality of packaged electronic chips being connected to one another in a common substrate is disclosed, the method comprising:
at least partially removing an indicator structure embedded in at least a part of the plurality of electronic chips;
detecting information indicative of the at least partial removal of the indicator structure; and
adjusting the processing upon detecting the information.

In an embodiment, highly accurate thinning of electronic chips (particularly semiconductor chips) may be performed in package, wherein the thinning of a plurality of electronic chips or even larger systems may be done simultaneously on (particularly mold) wafer level without requiring thin wafer handling.

Figure 2:
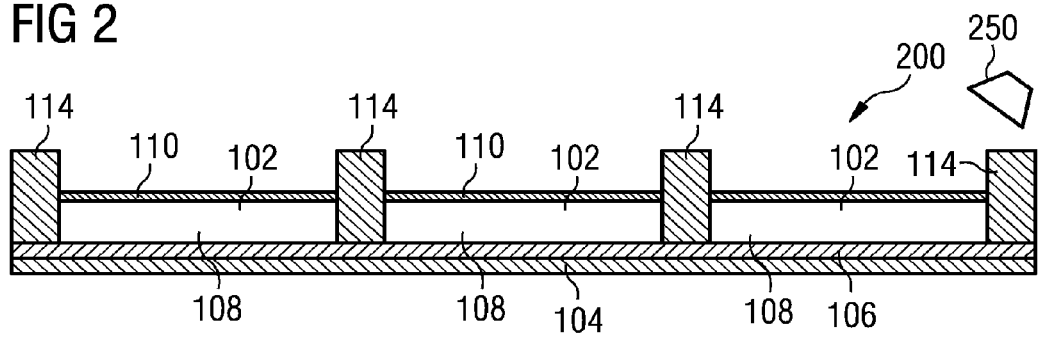
FIG. 2 shows the article according to FIG. 1 when the etching procedure has thinned down the article until exposure of an etch stop indicator layer to trigger an end of the etching procedure.

FIG. 1 shows an article 100 according to an exemplary embodiment which is processed according to a method of an exemplary embodiment so as to form a layer sequence 200 shown in FIG. 2.

The article 100 comprises a semiconductor substrate 102 such as a silicon wafer, wherein a plurality of electronic chips 108 are connected to one another within the semiconductor substrate 102. The various electronic chips 108 are semiconductor chips which are still connected to one another so that the article 100 is an article on wafer level, i.e. before singularization into the individual electronic chips 108. Each of the electronic chips 108 may comprise one or more integrated circuit components, such as transistors, diodes, or the like (not shown). A discontinuous indicator layer 110 is embedded within the electronic chips 108 and is separated only by sections of a mold structure 114. The indicator layer 110 may be formed in the semiconductor substrate 102 by implanting n-type dopant or p-type dopant and is formed by a material which can be removed by plasma etching so that it can be used for detecting a sensor signal serving for defining an appropriate endpoint of an etching procedure. Embedded or imbedded within the electronic chips 108 is hence the indicator layer 110 which for instance may have a significantly different mass and/or significantly different optical properties than the surrounding material of the electronic chips 108. This ensures that a pronounced and distinguishable sensor signal can be detected which can be clearly assigned to the indicator layer 110.

As can be taken from FIG. 1, the electronic chips 108 are all covered by a surface protection layer 104. Between the surface protection layer 104 and the electronic chips 108, one or more intermediate layers 106 may be formed. The line indicated by reference numeral 106 between the surface protection layer 104 and the mold wafer or embedded wafer level package (eWLP) formed by reference numerals 102, 108, 110, 114 indicates that one or more further processes (such as for instance redistribution, metallization, isolation) may have been performed earlier in the process flow on mold wafer level (after chip embedding in the mold structure 114).

In order to form the layer sequence 200 shown in FIG. 2 based on the article 100, a plasma etching procedure is carried out. Upon executing this etching procedure, a plasma etchant attacks an upper surface of the article 100 and therefore removes material of the semiconductor substrate 102. The position of the etch stop indicator layer 110 denotes a position at which it is desired that the etch procedure stops. The depth within the semiconductor substrate 102 at which the indicator layer 110 is formed, can be selected accordingly. FIG. 2 shows a scenario in which the plasma etching procedure has advanced to such a stage that the etch stop indicator layer 110 is now exposed on an upper surface of the layer sequence 200. When the etching procedure is further continued starting from the layer sequence 200 shown in FIG. 2, plasma etch induced removal of the etch stop indicator layer 110 starts because it is made of material which can be removed by the plasma etching procedure as well. However, by converting the etch stop indicator layer 110 into volatile matter (such as gas or plasma) as a result of the plasma etching, it becomes possible to detect this volatile matter by a detection unit or sensor 250. Since the chemical composition of the etch stop indicator layer 110 differs from that of the surrounding material of the semiconductor substrate 102, the detection of the volatile matter around the article 200 allows to detect when the removal of the etch stop indicator layer 110 starts. The event of such a detection of plasma etch products resulting from the plasma etching of the etch stop indicator layer 110 can be taken as a trigger for stopping the plasma etching procedure.

Hence, FIG. 1 and FIG. 2 show a mold wafer 102, 108, 110, 114 with an additional etch stop indicator layer 110 imbedded in the electronic chips 108 to be thinned at the target depth providing an endpoint signal for the etch process when getting exposed (and subsequently at least partially removed) during the plasma thinning process. Figure shows the status prior to thinning in package. FIG. 2 shows the status after thinning in package (with selectivity to the mold). The etch stop of the plasma thinning process is triggered by an endpoint signal obtained upon exposure of the implemented etch stop indicator layer 110 by releasing and detecting material thereof. Since the thinning of the semiconductor substrate 102 and also of the electronic chips 108 is performed after packaging into the mold structure 114 and on wafer level (i.e. before singularization of the individual electronic chips 108), handling of individual thinned and hence sensitive electronic chips 108 may be prevented advantageously. The use of a buried etch stop indicator layer 110 furthermore allows to define the thickness of the finished electronic chips 108 with a high accuracy.

Figure 3:
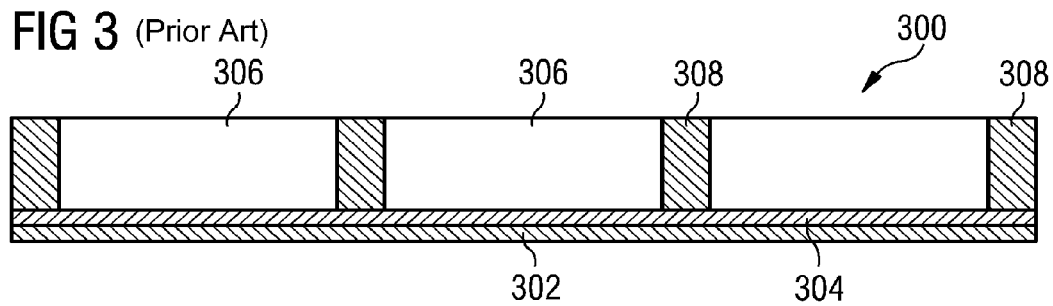
FIG. 3 and FIG. 4 show a conventional article at a beginning of an etching procedure and when an etch stop is reached.
Figure 4:
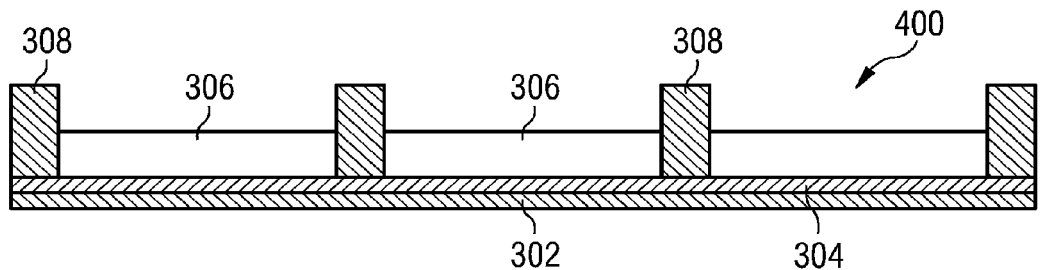

In contrast to this, FIG. 3 and FIG. 4 illustrate a conventional approach of controlling and finally stopping an etching procedure. As can be taken from FIG. 3, a plurality of electronic chips 306 are accommodated on top of a protection structure 302, 304, wherein the individual electronic chips 306 are separated by sections of a mold structure 308. When the etching procedure starts starting from article 300 shown in FIG. 3, material of the electronic chips 306 is removed. The etching procedure is stopped after a predefined time at which it is expected that the thinning has reached the desired depth level, compare FIG. 4. However, if there is some inhomogeneity of the material among the various electronic chips 306, the stopping of the etching procedure is inaccurate.

Hence, FIG. 3 shows a mold wafer 306, 308 without additional layers imbedded in the electronic chips 306 for end-pointing. The status shown in FIG. 3 is prior to thinning in package. The status shown in FIG. 4 is after thinning in package which is done with a timed plasma etching (with selectivity to the mold structure 308).

Similar problems occur in another conventional approach when an etch stop layer (not shown) is embedded within the electronic chips 306 and which is non-etchable, because in such a scenario there is also no positive signal that an etching procedure should now be stopped.

Figure 5:
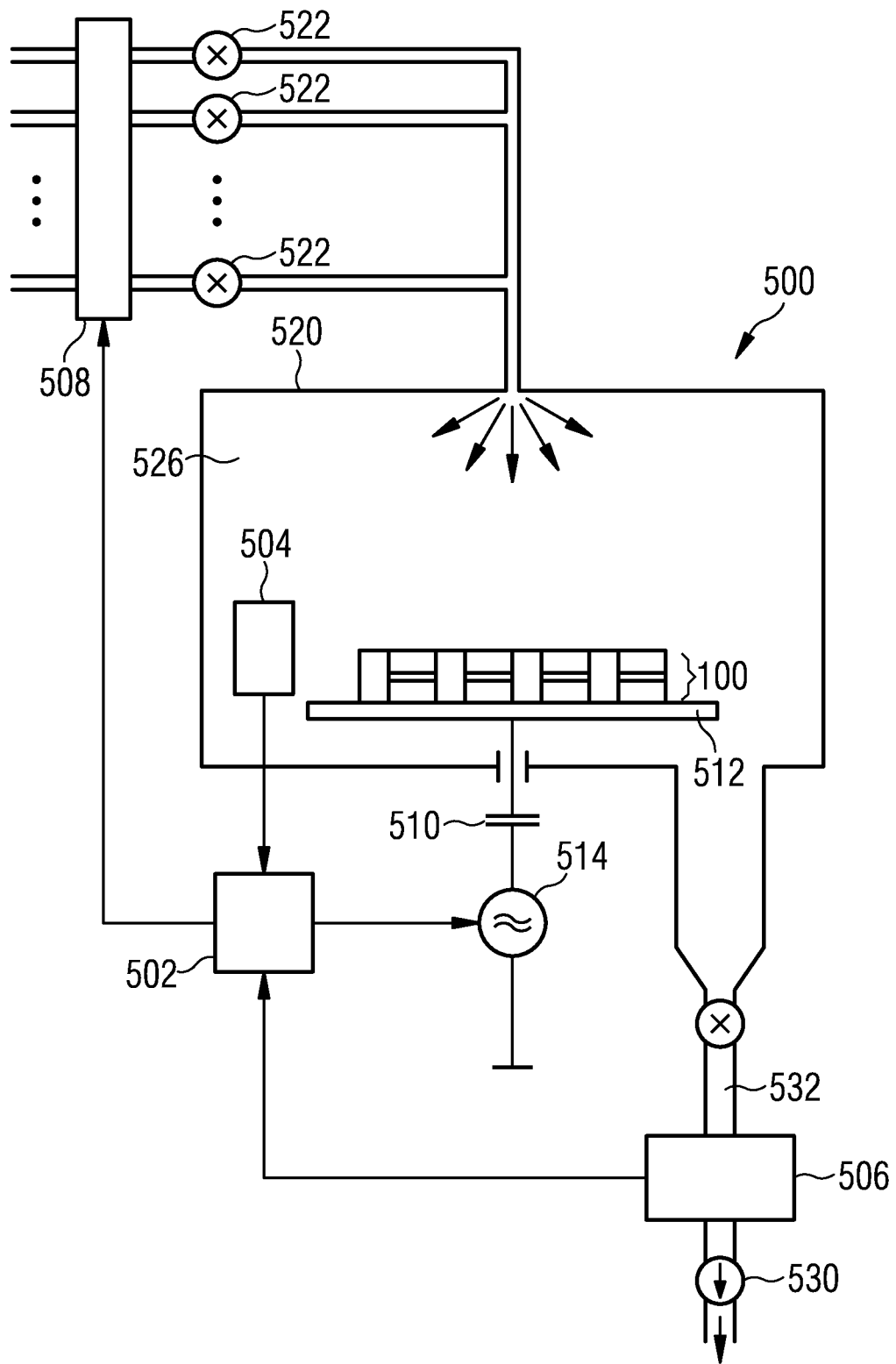
FIG. 5 shows a device for processing a plurality of packaged electronic chips on wafer level according to an exemplary embodiment.

FIG. 5 illustrates a device 500 for processing a plurality of packaged electronic chips on wafer level, such as the article 100 shown in FIG. 1 in detail and shown schematically in FIG. 5.

The device 500 comprises an etching chamber 520. Within the etching chamber 520, the article 100 is mounted on an electrode 512. A high frequency signal can be applied to this electrode 512, as indicated by a high frequency generator unit 514. A coupling capacitor 510 may be arranged between the electrode 512 and the high frequency generator unit 514. Via valves 522 on a top of the etching chamber 520, gas can be introduced into an etching volume 526 delimited by the etching chamber 520. The etching process is controlled by a plasma etching unit 508 which provides such a gas as a basis for a subsequent plasma etching. A pump 530 sucks effluent gas through an exhaust conduit 532 out of the device 500.

When the plasma etching procedure starts, plasma generated by the introduced gas and by the electrical conditions within the etching chamber 520 as defined by the high frequency generator unit 514 delivering power to the wafer mounting electrode 512, material of the electronic chips 108 of the article 100 is removed. This modifies the volatile matter, i.e. gas and plasma mixture, within the etching chamber 520. However, when such an amount of material has been removed from the article 100 that the etch stop indicator layer 110 is exposed to a surface, material of this etch stop indicator layer 110 starts to be removed and characteristically changes the composition of the volatile matter within the etching chamber 520. A first sensor or detection unit 504 detects the characteristics of the plasma within the plasma chamber 520 and will provide a modified detection signal when the removal of the etch stop indicator layer 110 starts. This may allow this first detection unit 504 to send a trigger signal to a control unit 502 (such as a central processing unit, CPU or a microprocessor) so as to control the plasma etching unit 508 to be switched off and to control the high frequency generator unit 514 to be switched off, to thereby stop the etching procedure.

Additionally (to improve the accuracy in view of the resulting redundancy) or alternatively (to keep the detection procedure as simple as possible), a second detection unit 506 is shown which is arranged in the exhaust conduit 532 of the device 500 for detecting characteristics of the effluent gas. Again, the characteristics of the effluent gas is changed characteristically when the removal of the etch stop indicator layer 110 has started. Hence, also the second detection unit 506 may send a detection signal to the control unit 502. Upon obtaining corresponding detection signals from both detection unit 504, 506, the control unit 502 may control the plasma etching unit 508 to terminate the etching procedure and may control of the high frequency generator unit 514 to stop delivering power to the wafer mounting electrode 512. Alternatively, the termination of the etching procedure may already be triggered by the control unit 502 when only one of the two detection signals of the detection units 504, 506 indicates a start of the removal of the etch stop indicator layer 110.

Figure 6:
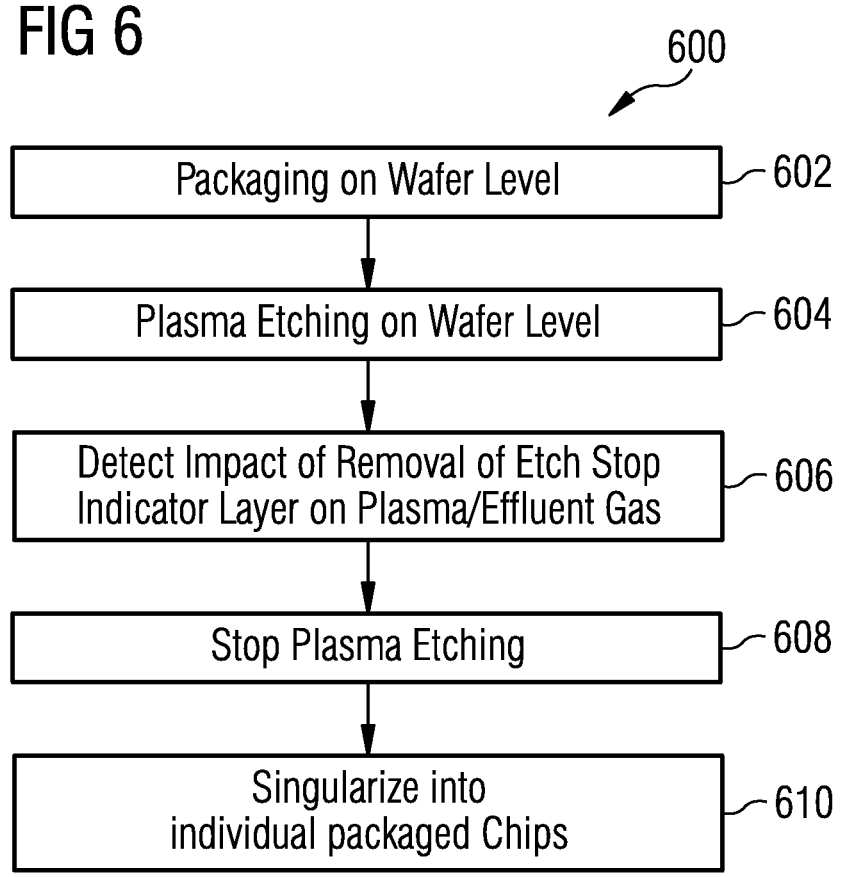
FIG. 6 shows a block diagram of a method of processing a plurality of packaged electronic chips on wafer level according to an exemplary embodiment.

FIG. 6 shows a block diagram 600 of a method of processing a plurality of electronic chips 108 on wafer level according to an exemplary embodiment.

In a block 602, the semiconductor wafer 102 comprising the electronic chips 108 are packaged on wafer level by connecting the semiconductor wafer 102 with a mold structure 114. In a subsequent block 604, plasma etching of the electronic chips 108 starts on wafer level. In a subsequent block 606, volatile matter in an environment of the plasma etched electronic chips 108 is detected and analysed to thereby derive information indicative of an exposure of the etch stop indicator layer 110 embedded within the electronic chips 108 and being exposed after the etching has removed chip material above the etch stop indicator layer 110. In a subsequent block 608, the plasma etching procedure is stopped upon detecting the exposure of the etch stop indicator layer 110. In a subsequent block 610, the processed semiconductor wafer 102 packaged by the mold structure 114 is singularized into individually packaged electronic chips 108.

FIG. 7 to FIG. 11 shows different structures obtained during carrying out a method of processing a plurality of individual electronic chips 108 packaged within a common mold substrate or mold structure 114 according to an exemplary embodiment.

Figure 7:
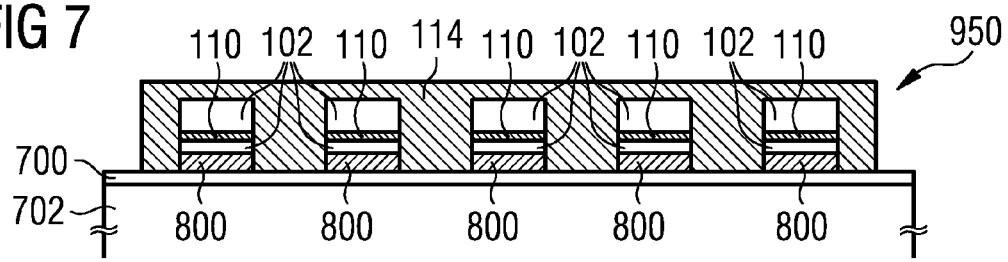
FIG. 7 to FIG. 11 show cross sectional views of different structures obtained during carrying out a method of processing a plurality of electronic chips packaged within a common mold substrate according to an exemplary embodiment.

FIG. 7 shows a cross section of a plate-shaped mold structure 114 having a plurality of recesses which are arranged in a matrix pattern, i.e. in rows and columns. Each of the recesses accommodates a corresponding one of a plurality of electronic chips 108. Each of the electronic chips 108 has an etch stop layer 110 formed within a semiconductor substrate 102, for instance a piece of silicon. One or more integrated circuit components 800 (such as transistors, diodes, etc.) are formed in a surface portion of the respective semiconductor substrate 102.

In order to obtain the structure shown in FIG. 7, the individual electronic chips 108 are adhered in a matrix pattern on an adhesive tape 700 (for instance a double sided sticky tape). A temporary solid carrier 702 may be arranged below the adhesive tape 700 to increase stability. After that, this arrangement is covered by mold material in liquid or granulate form which is subsequently hardened, thereby encapsulating the electronic chips 108 in mold structure 114. The result is an article 950 according to an exemplary embodiment.

The adhesive tape 700 and the temporary solid carrier 702 (which may be made of a metal such as copper, plastic, polymer, or a semiconductor such as silicon, etc.) form a temporary carrier system. As an alternative to the use of adhesive tape 700 and temporary solid carrier 702 it is also possible to use a temporary carrier system constituted by UV glue on a temporary glass carrier.

Figure 8:
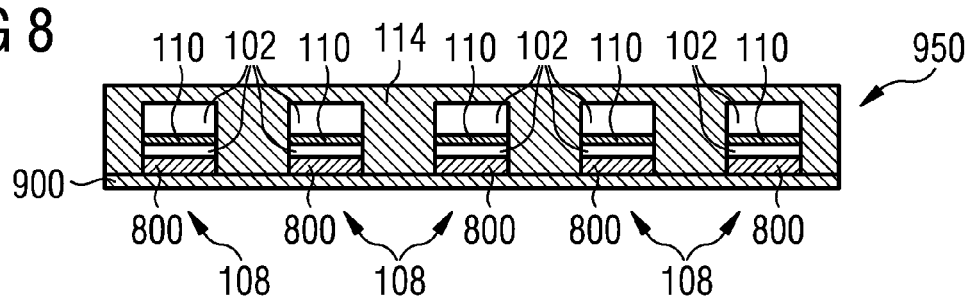

FIG. 8 shows the arrangement of FIG. 7 after so-called debonding, i.e. after removing the temporary solid carrier 702 and after removing or delaminating the adhesive tape 700 from the rest of the arrangement of FIG. 7. Then, a common thin film layer 900 (such as a metallization layer) may be applied on the surface of the mold structure 114 and the electronic chips 100. A corresponding thin film structure may include the deposition and patterning of one or more dielectric layers, the deposition and patterning of one or more electrically conductive layers (such as a metallic redistribution layer) and the formation of solder balls or the like, as known by a person skilled in the art of eWLB.

Although not shown in the figures, the structure of FIG. 8 is then made subject to a grinding procedure for removing material of the mold structure 114 above the electronic chips 108. At the end of the grinding procedure, the upper surfaces of the electronic chips 108 are exposed, as can be taken from FIG. 9.

Figure 9:
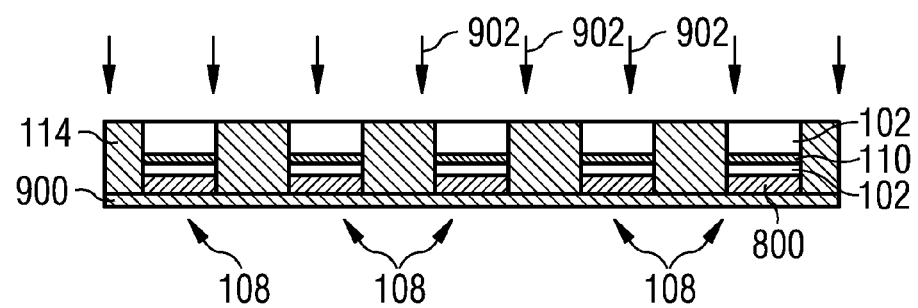

Subsequently, as indicated schematically in FIG. 9 by arrows 902, the entire structure is made subject to a plasma etching procedure, wherein the plasma attacks and removes semiconductor material on the upper side of the structure of FIG. 9 to perform thinning of the electronic chips 108 from the backside. Thereby, the electronic chips 108 are thinned by plasma etching, whereas the mold structure 114 serves as an etch mask and therefore remains unaffected by the etching.

Figure 10:
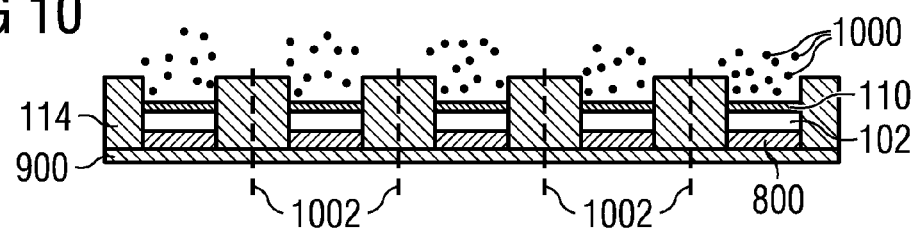

At a certain time during the etching procedure, the etch stop indicator layers 110, which are formed on the same height level within each of the electronic chips 108, are exposed. Upon exposure of the etch stop indicator layer 110, material of the latter is converted from the solid phase into a volatile phase, wherein the generated volatile matter is denoted with reference 1000. This is shown in FIG. 10.

The volatile matter 1000 can then be detected, for instance in a way as described above referring to FIG. 5. The detection of volatile matter 1000 originating from the etch stop indicator layer 110 may then be the trigger to stop the plasma etching procedure. As indicated in FIG. 10 by separation lines 1002, the structure shown in FIG. 10 may then be separated into a plurality of single, individual electronic chips 108, for instance by sawing.

Figure 11:
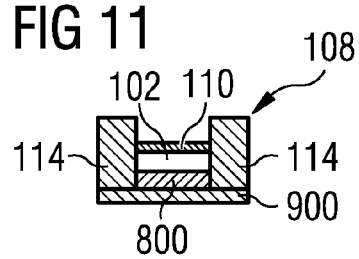

One resulting electronic chip 108 according to an exemplary embodiment is shown in FIG. 11. This electronic chip 108 already has a metallization, etc. formed by a part of thin film layer 900 as well as a package formed by a part of the mold structure 114.

Hence, thinning of the semiconductor material may be performed before singularization, thereby preventing handling of thinned electronic chips 108 before packaging while at the same time ensuring a precise definition of the thickness of the electronic chips 108, since the etching procedure can be accurately terminated upon exposing the etch stop indicator layer 110.

Figure 12:
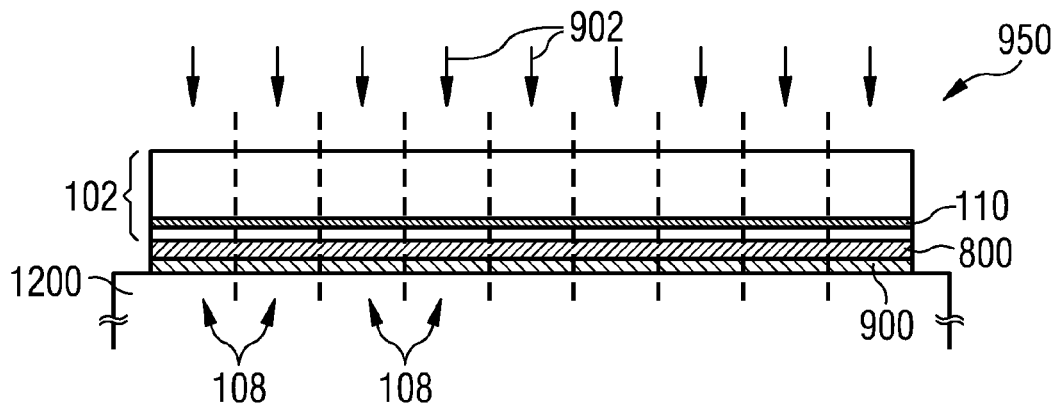
FIG. 12 to FIG. 14 show cross sectional views of different structures obtained during carrying out a method of processing a plurality of electronic chips on wafer level according to an exemplary embodiment.
Figure 13:
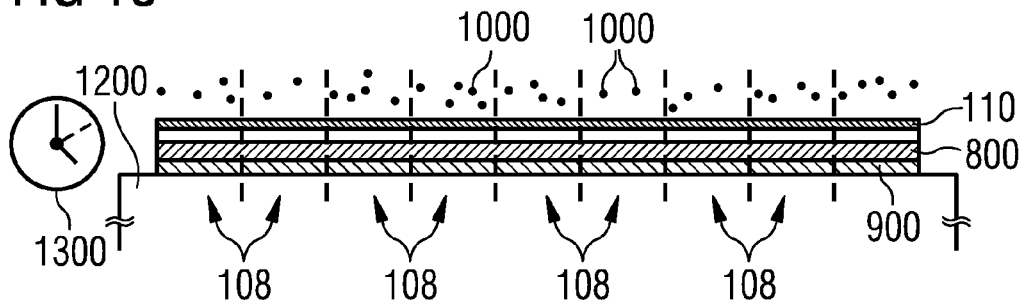
Figure 14:
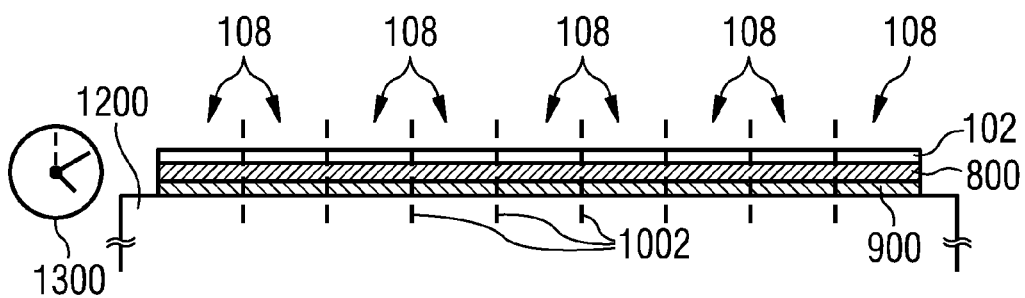

FIG. 12 to FIG. 14 shows different structures obtained during carrying out a method of processing a plurality of electronic chips 108 on wafer level according to an exemplary embodiment.

FIG. 12 shows an article 950 according to an exemplary embodiment having a semiconductor wafer 102 with a buried continuous (i.e. uninterrupted) etch stop indicator layer 110 within the bulk semiconductor material. In this embodiment, the electronic chips 108 to be formed are sections of the plate-shaped semiconductor wafer 102. A lower surface of the semiconductor substrate or wafer 102 has been processed so as to form integrated circuit components 800 in a corresponding surface portion. After that, a thin film layer 900 can be formed on top of the integrated circuit components 800. Subsequently, the entire semiconductor wafer 102 may be thinned from a backside by executing a plasma etching procedure on wafer level, as indicated by reference 902.

Since the procedure described referring to FIG. 12 to FIG. 14 is performed on a non-packaged wafer 102, i.e. a wafer 102 without a mold structure, it may be advantageous to mechanically support or stabilise the wafer 102 during the following thinning procedure. FIG. 12 shows that the wafer 102 is supported by a temporary handling wafer 1200 (such as a glass carrier) on which wafer 102 is mounted and which is to be removed from the wafer 102 upon finishing the processing thereof. Although not shown in FIG. 12 to FIG. 14, an intermediate layer such as a double sided adhesive tape 700 (shown in FIG. 7) may be located between the wafer 102 and the temporary handling wafer 1200.

However, as an alternative to a temporary handling wafer 1200, it is also possible to support the wafer 102 by a permanent carrier structure which remains part of the finished product and is not removed at the end. For example, the thin film layer 900 may be formed with such a large thickness (for instance may be formed as a copper layer having a thickness between 50 µm and 100 µm) that the thin film layer 900 being integrally formed with the wafer 102 provides sufficient support for handling the thinned wafer 102 without the danger of deteriorating or even destroying it.

A third alternative for mechanically stabilising the wafer 102 during the thinning procedure without the risk of damaging it is to treat the wafer 102 by lithography or the like so as to form locally thickened supporting portions between thinner portions, for instance of the semiconductor material 102. Upon performing the subsequent thinning procedure, the thicker supporting portions remain sufficiently thick to sufficiently stabilise the thinner portions.

FIG. 13 shows the structure which is obtained by the plasma etching when the etch stop indicator layer 110 is exposed. This results in the generation of modified volatile matter 1000, as described above in more detail. In the present embodiment, the detection of the volatile matter 1000 is a fingerprint of the exposure of the etch stop indicator layer 110 but is not yet the trigger for the termination of the etching procedure.

In contrast to this, upon detecting the volatile matter 1000, an additional predefined etching time is added, as indicated schematically by reference 1300. This additional predefined etching time may be selected for example so that, after its expiry, the entire etch stop indicator layer 110 is removed, which corresponds to the structure shown in FIG. 14. The resulting structure may then be separated at separating lines 1002 in order to obtain individual electronic chips 108.

FIG. 15 to FIG. 18 shows different structures obtained during carrying out a method of processing a plurality of electronic chips 108 on wafer level packaged within a mold substrate 114 according to an exemplary embodiment.

Figure 15:
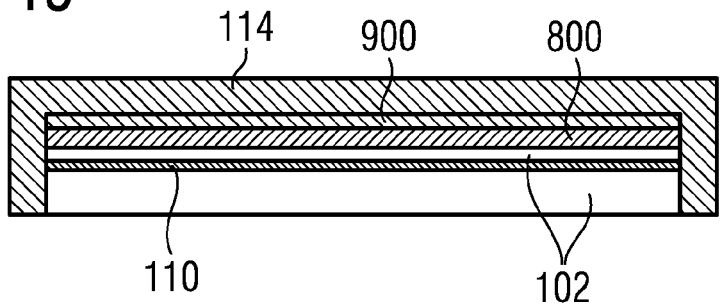
FIG. 15 to FIG. 18 show cross sectional views of different structures obtained during carrying out a method of processing a plurality of electronic chips on wafer level, wherein the wafer as a whole is packaged within a mold substrate according to an exemplary embodiment.

In FIG. 15, a plate-shaped mold structure 114 is shown which has been formed as an encapsulation over a processed wafer 102. For this purpose, a liquid or granulate mold material may be molded around the wafer 102 and may be subsequently hardened. A recess within the mold structure 114 accommodates the complete semiconductor wafer 102 (including thin film layer 900 and integrated circuit components 800) which may have the same properties as described above referring to FIG. 12. The semiconductor wafer 1200 is inserted into the mold structure 114 so that the integrated circuit components 800 are located in an interior of the resulting structure and that a non-processed part of the semiconductor substrate 102 of the wafer 1200 is exposed at an external surface.

Figure 16:
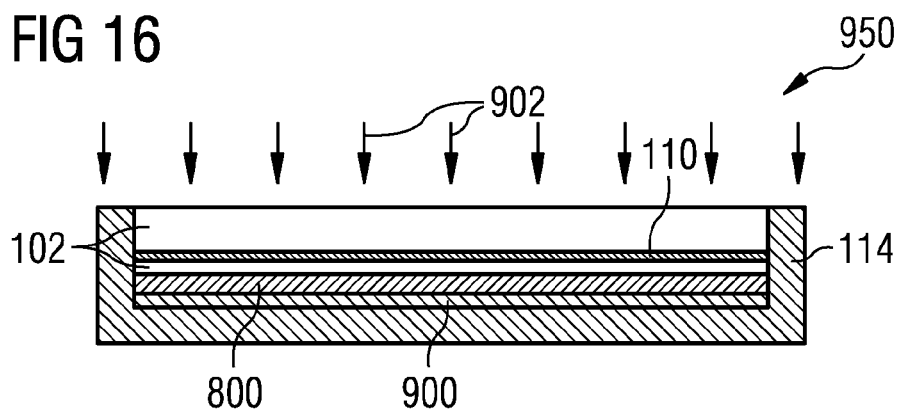

As can be taken from FIG. 16, a resulting article 950 according to an exemplary embodiment which is then made subject to a plasma etching treatment, see reference numeral 902, whereby semiconductor material on the non-processed external surface of the semiconductor wafer 102 is removed, while material of the mold structure 114 serves as etch mask and therefore remains unaffected by the etching procedure.

It should be said that the plasma etching needs not necessarily be used for etching the entire semiconductor material. It is for instance alternatively possible that a first portion of the semiconductor material is removed by a mechanical thinning procedure such as polishing or grinding, and only a deeper second portion of the semiconductor material is removed by plasma etching. More generally, any desired combination of different mechanical and or/chemical material removal procedures is possible, such as any combination of grinding, spin etching, chemical mechanical polishing (CMP), wet etching, plasma etching, etc.

Figure 17:
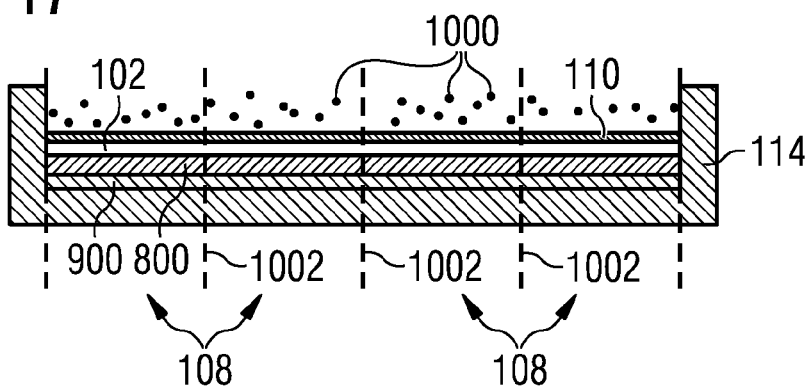

Again, exposure of the etch stop indicator layer 110 is detected and serves as a trigger for finishing the etching procedure, compare FIG. 17. When the etching procedure is finished, the resulting structure can be separated into individual electronic chips 108 at separation lines 1002.

Figure 18:
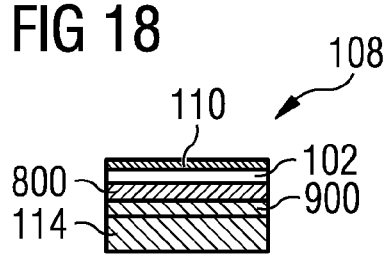

As can be taken from FIG. 18, a stabilising bottom of the resulting electronic chips 108 is formed by a remaining portion of the mold structure 114, and they already include a metallization as part of the thin film layer 900. However, an additional optional packaging procedure (not shown) may be performed with the resulting electronic chips 108 in order to encapsulate them by mold material.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of processing a plurality of packaged electronic chips being connected to one another in a common substrate, the method comprising:
    etching the electronic chips;
    detecting information indicative of an at least partial removal of an indicator structure following an exposure of the indicator structure embedded within at least a part of the electronic chips and being exposed after the etching has removed chip material above the indicator structure; and
    adjusting the processing upon detecting the information indicative of the at least partial removal of the indicator structure.

2. The method according to claim 1, wherein detecting information comprises analyzing volatile matter in an environment of the electronic chips, the volatile matter being impacted by an etching product generated by removing material of the indicator structure from the electronic chips by the etching.

3. The method according to claim 2, wherein the analyzed volatile matter is plasma used for plasma etching and being modified by the at least partial removal of the indicator structure.

4. The method according to claim 3, wherein analyzing the plasma is performed by at least one of the group consisting of Optical Emission Spectroscopy, and Coherent Anti Stokes Raman Scattering.

5. The method according to claim 2, wherein the analyzed volatile matter is effluent gas generated when removing material of the indicator structure by plasma etching.

6. The method according to claim 5, wherein analyzing the effluent gas is performed by at least one of the group consisting of Optical Emission Spectroscopy, and Mass Spectroscopy.

7. The method according to claim 1, wherein the indicator structure comprises one of the group consisting of dopant, implanted material, and a deposited layer.

8. The method according to claim 1, wherein the etching is a selective etching so that an etching rate of material of the indicator structure is different from an etching rate of material next to the indicator structure.

9. The method according to claim 1, wherein the plurality of packaged electronic chips being connected to one another in the common substrate comprise a semiconductor wafer being divided into the electronic chips by mold structures as package.

10. The method according to claim 1, wherein adjusting the processing comprises at least one of the group consisting of stopping the etching, modifying an etching rate, modifying an etch parameter, modifying the etch process, and continuing the etching with the same etch conditions or with modified etch conditions for a predefined additional etching time interval.

11. The method according to claim 1, wherein the indicator structure is a continuous or discontinuous indicator layer embedded at a constant depth level within all electronic chips.

12. The method according to claim 1, further comprising:
    stopping the etching;
    subsequently singularizing the electronic chips.

13. A method of processing a plurality of electronic chips being connected to one another by a common substrate, the method comprising:
    plasma etching the electronic chips simultaneously;
    detecting volatile matter in an environment of the plasma-etched electronic chips to thereby derive information indicative of an exposure and an at least partial removal of an indicator layer embedded within the electronic chips and being exposed after the etching has removed chip material above the indicator layer, wherein the volatile matter is impacted by the exposure of the indicator layer; and adjusting the plasma etching upon detecting the exposure of the indicator layer.

14. The method according to claim 13, wherein processing the plurality of electronic chips comprises processing a plurality of electronic chips being packaged by a mold structure.

* * * * *